US011526196B2

(12) United States Patent
Jung

(10) Patent No.: US 11,526,196 B2
(45) Date of Patent: Dec. 13, 2022

(54) DISPLAY DEVICE

(71) Applicant: SAMSUNG DISPLAY CO., LTD., Yongin-si (KR)

(72) Inventor: Tae Hyeog Jung, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 138 days.

(21) Appl. No.: 16/888,206

(22) Filed: May 29, 2020

(65) Prior Publication Data
US 2021/0034106 A1 Feb. 4, 2021

(30) Foreign Application Priority Data

Jul. 30, 2019 (KR) .......................... 10-2019-0092531

(51) Int. Cl.
G06F 1/16 (2006.01)
H01L 27/32 (2006.01)
H01L 51/00 (2006.01)
H01L 51/52 (2006.01)

(52) U.S. Cl.
CPC .......... *G06F 1/1641* (2013.01); *G06F 1/1652* (2013.01); *G06F 1/1681* (2013.01); *H01L 27/323* (2013.01); *H01L 27/3244* (2013.01); *H01L 51/0097* (2013.01); *H01L 51/5237* (2013.01); *G06F 1/1643* (2013.01); *H01L 2251/5338* (2013.01)

(58) Field of Classification Search
CPC .... G06F 1/1652; G06F 1/1681; G06F 1/1641; G06F 1/1616; G06F 1/1643; H05K 5/0017; H05K 5/0226; H05K 5/03; H05K 1/028
See application file for complete search history.

(56) References Cited

U.S. PATENT DOCUMENTS

| 9,661,719 | B2 | 8/2017 | Jang et al. |
| 10,067,536 | B1* | 9/2018 | Watamura ............. G06F 1/1652 |
| 2016/0178945 | A1* | 6/2016 | Ryu .................. G02F 1/133514 |
| | | | 349/42 |
| 2017/0064844 | A1* | 3/2017 | Hsu .......................... G02F 1/13 |
| 2018/0107250 | A1* | 4/2018 | Cho .................... H01L 51/0097 |
| 2018/0343756 | A1 | 11/2018 | Lin et al. |
| 2018/0366679 | A1* | 12/2018 | Kim ..................... H01L 51/5237 |
| 2019/0012028 | A1* | 1/2019 | Park ...................... G06F 1/1641 |
| 2019/0036068 | A1* | 1/2019 | Kim ...................... G06F 1/1641 |
| 2019/0104626 | A1* | 4/2019 | Jeon .................... H04M 1/0268 |
| 2020/0233451 | A1* | 7/2020 | Hong .................... G06F 1/1667 |

FOREIGN PATENT DOCUMENTS

| KR | 20180005316 | 1/2018 |
| KR | 20180043441 | 4/2018 |

* cited by examiner

*Primary Examiner* — Abhishek M Rathod

(74) *Attorney, Agent, or Firm* — F. Chau & Associates, LLC

(57) ABSTRACT

A display device includes a display module, a first support member and a second support member disposed below the display module and separated from each other, wherein the first support member and second support member are disposed with respect to a folding axis; and a planarization member disposed on one side of the first support member and that maintains one surface of the first support member and one surface of the second support member on a same reference surface.

20 Claims, 19 Drawing Sheets

FIG. 3
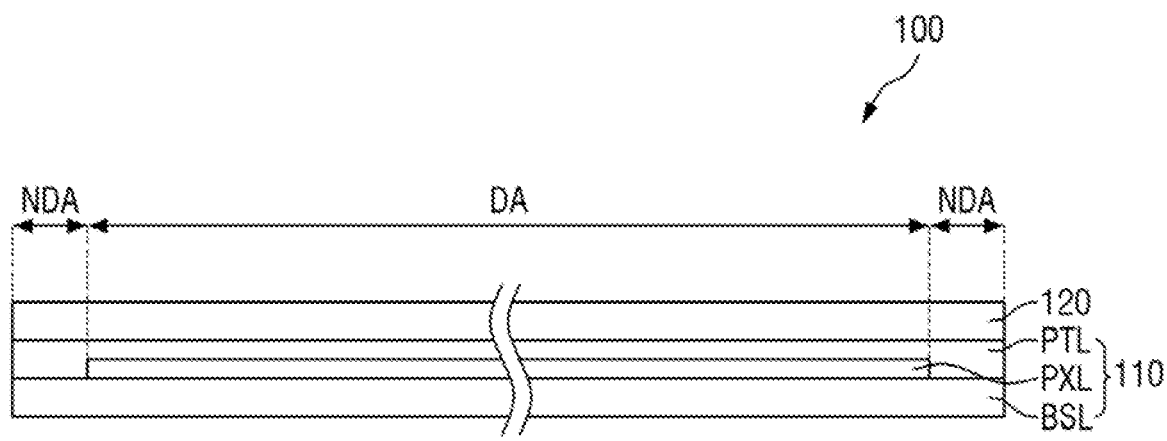
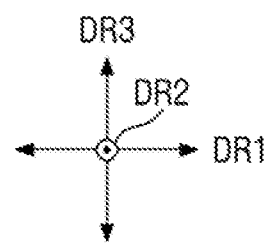

DISPLAY DEVICE

This application claims priority under 35 U.S.C. § 119 from, and the benefit of, Korean Patent Application No. 10-2019-0092531, filed on Jul. 30, 2019 in the Korean Intellectual Property Office, the contents of which are herein incorporated by reference in their entirety.

BACKGROUND

1. Technical Field

Embodiments of the present disclosure are directed to a display device.

2. Discussion of the Related Art

Display devices display images and include organic light-emitting display panels, such as organic light-emitting diodes (OLEDs) or quantum dot electroluminescence (QD-EL) devices, or display panels such as liquid crystal display panels.

Mobile electronic devices include display devices to provide images to users. A proportion of mobile electronic devices that have larger display screens than conventional electronic devices but the same or smaller volume or thickness is increasing, and foldable or bendable display devices are being developed that can be folded or unfolded to provide a larger screen while in use.

In a foldable display device, metal plates separated from each other with respect to a folding axis are attached to a lower portion of a display module to fold the foldable display device. When two metal plates are attached to a display module, a step can occur between the two metal plates due to assembly tolerance and the use of a foldable display device. In this case, a bending deformation of the display module can be visually recognized around the folding axis.

SUMMARY

Embodiments of the present disclosure provide a display device that has a reduced occurrence of a step between two metal plates that separate from each other with respect to a folding axis due to a magnetic planarization member.

An embodiment of a display device includes a display module, a first support member and a second support member disposed below the display module and separated from each other, wherein the first support member and second support member are disposed with respect to a folding axis; and a planarization member disposed on one side of the first support member and that maintains one surface of the first support member and one surface of the second support member on a same reference surface.

An embodiment of a display device includes a display module that includes a first non-foldable region, a second non-foldable region, and a foldable region located between the first non-foldable region and the second non-foldable region; and a foldable member disposed below the display module, wherein the foldable member includes a first support member disposed below the first non-foldable region and a second support member disposed below the second non-foldable region, wherein the first and second support members are separated from each other, a third support member disposed below the first support member, a fourth support member disposed below the second support member, and hinge members disposed side by side on one side of the third support member and one side of the fourth support member, wherein the third and fourth support members face each other, and a planarization member that maintains one surface of the first support member and one surface of the second support member on a same reference surface, wherein the first support member and second support member are disposed with respect to a folding axis therebetween.

An embodiment of a display device includes a display module, a first support member and a second support member disposed below the display module and separated from each other, wherein the first support member and second support member are disposed with respect to a folding axis therebetween, and a planarization member disposed on one side of the first support member wherein the planarization member is fixed to the first support member by an adhesive member and is detachable from the second support member.

According to the aforementioned and other embodiments of the present disclosure, a display device is provided in which occurrence of a step between two metal plates separated from each other with respect to a folding axis is reduced using a magnetic planarization member.

BRIEF DESCRIPTION OF THE DRAWINGS

FIG. 3 is a cross-sectional view of a configuration of a display device shown in FIG. 1.

DETAILED DESCRIPTION OF EXEMPLARY EMBODIMENTS

Embodiments of the present disclosure will now be described more fully hereinafter with reference to the accompanying drawings, in which exemplary embodiments of the disclosure are shown. This disclosure may, however, be embodied in different forms and should not be construed as limited to the embodiments set forth herein.

It will also be understood that when a layer is referred to as being "on" another layer or substrate, it can be directly on the other layer or substrate, or intervening layers may also be present. The same reference numbers may indicate the same components throughout the specification. In the attached figures, the thickness of layers and regions may be exaggerated for clarity.

Embodiments of the present disclosure will hereinafter be described with reference to the accompanying drawings.

Figure 1:
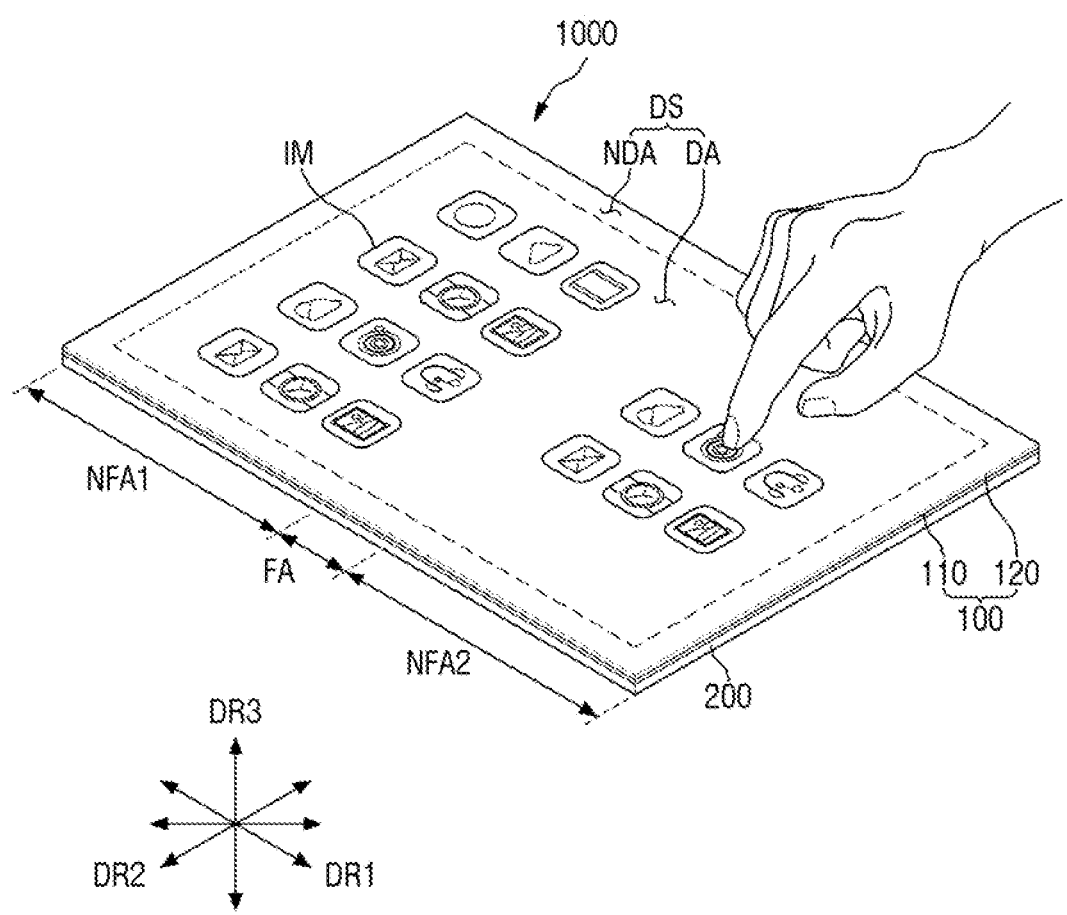
FIG. 1 is a perspective view of a display device according to an embodiment of the present disclosure.
Figure 2:
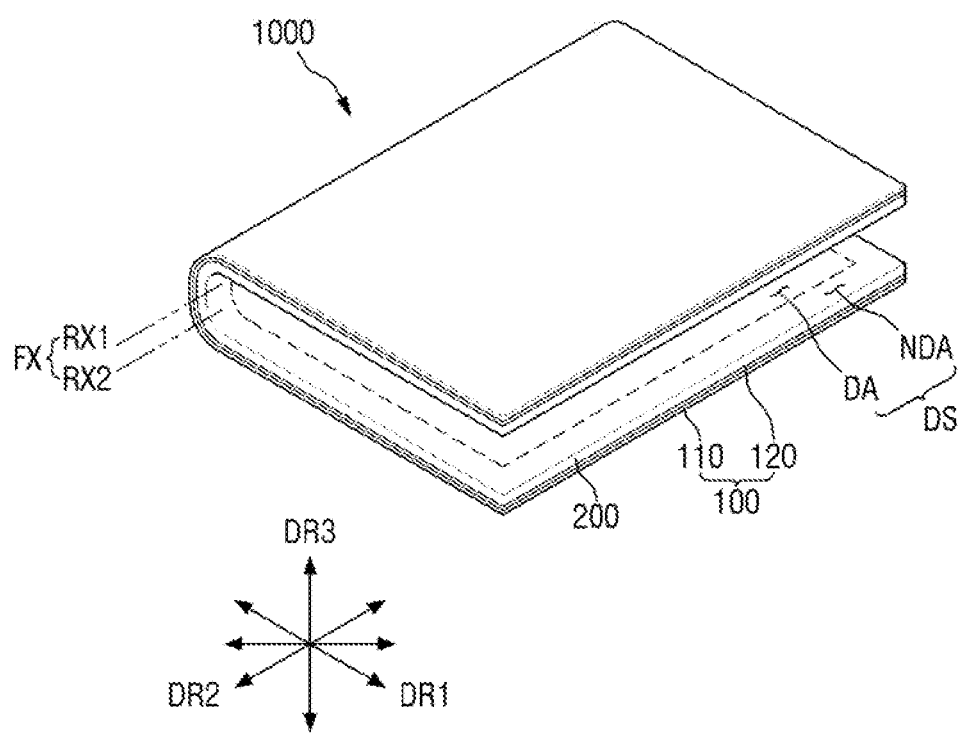
FIG. 2 illustrates a state in which a display device shown in FIG. 1 is folded inward.

FIG. 1 is a perspective view of a display device according to an embodiment of the present disclosure. FIG. 2 illustrates a state in which a display device shown in FIG. 1 is folded inward.

Referring to FIGS. 1 and 2, a display device 1000 according to an embodiment of the present disclosure has a rectangular shape with long sides in a first direction DR1 and short sides in a second direction DR2 that crosses the first direction DR1. However, embodiments of the present disclosure are not limited thereto, and in other embodiments, the display device 1000 can have different shapes. The display device 1000 is a flexible or foldable display device 1000 that can be folded or unfolded with respect to a folding axis FX that extends in the second direction DR2.

According to an embodiment, the display device 1000 is divided into a plurality of regions by folding. For example, the display device 1000 is divided into a foldable region FA in which the display device 1000 is folded and two flat non-foldable regions NFA1 and NFA2. The non-foldable regions NFA1 and NFA2 are spaced apart in the first direction DR1 with the foldable region FA disposed between the two non-foldable regions NFA1 and NFA2. In a present embodiment, there is one foldable region FA in the display device 1000, but embodiments of the present disclosure are not limited thereto, and in other embodiments, there may be a plurality of foldable regions in the display device 1000.

According to an embodiment, the folding axis FX includes a first rotation axis RX1 and a second rotation axis RX2, which extend in the second direction DR2 and are disposed adjacent to each other to provide the display device 1000 with a biaxial rotation axis. The foldable region FA overlaps the first and second rotation axes RX1 and RX2, and the display device 1000 can be folded with respect to the first rotation axis RX1 and the second rotation axis RX2.

According to an embodiment, the display device 1000 includes a display module 100 and a foldable member 200 disposed below the display module 100. An upper surface of the display module 100 is a display surface DS that is parallel to the first direction DR1 and the second direction DR2. Images IM generated by the display module 100 are displayed to a user through the display surface DS.

According to an embodiment, the display surface DS includes a display region DA and a non-display region NDA around the display region DA. An image can be displayed in the display region DA but is not displayed in the non-display region NDA. The non-display region NDA surrounds the display region DA and forms an edge portion of the display device 1000 that is provided with a predetermined color.

According to an embodiment, the display module 100 is flexible and includes a display panel 110 and a touch sensing unit 120 disposed on the display panel 110. The display panel 110 generates an image and displays the image to a user. The display panel 110 may be a liquid crystal display panel, an organic light-emitting display panel that includes organic light emitting diodes (OLEDs), a quantum dot electroluminescence (QD-EL) device, an electrophoretic display panel, or an electrowetting display panel, or any other display panel that can display an image.

Quantum dots are semiconductor materials with a nanoscale crystalline structure and are composed of hundreds to thousands of atoms. Because quantum dots are very small, the quantum dots have a large surface area per unit volume, and most atoms of a quantum dot are present on surfaces of nanocrystals and exhibit a quantum confinement effect. Due to the quantum confinement effect, an emission wavelength can be adjusted by adjusting a size of the quantum dot, and has excellent color purity and high photoluminescence (PL) emission efficiency. A QD-EL device according to an embodiment is a three-layered device that includes a hole transport layer (HTL) and an electron transport layer (ETL) that are disposed an both ends thereof with a quantum dot light-emitting layer interposed therebetween.

According to an embodiment, the touch sensing unit 120 can sense an external input, such as a user's hand or a touch pen, convert the external input into a predetermined input signal, and transmit the input signal to the display panel 110. The touch sensing unit 120 includes a plurality of touch sensor units that can sense an external input. The touch sensor units sense an external input using capacitance. The display panel 110 receives the input signal from the touch sensing unit 120 and generates an image corresponding to the input signal.

According to an embodiment, the foldable member 200 supports the display module 100 and can be folded by being rotated about the first and second rotation axes RX1 and RX2. As the foldable member 200 is folded, the flexible display module 100 is folded by the foldable member 200. When folded, the display device 1000 is folded inward by the foldable member 200 such that display surfaces DS in different regions of the display module 100 face each other.

A more specific embodiment of the foldable member 200 will be described below in detail with reference to FIGS. 4 and 5. Hereinafter, a direction normal to a plane parallel to the first direction DR1 and the second direction DR2 is defined as a third direction DR3. The third direction DR3 includes an upper direction and a lower direction opposite to the upper direction.

FIG. 3 is a cross-sectional view of a configuration of a display device shown in FIG. 1.

Referring to FIG. 3, according to an embodiment, the display panel 110 includes a base layer BSL, a pixel layer PXL disposed on the base layer BSL, and a protective layer PTL disposed on the base layer BSL that covers the pixel layer PXL.

According to an embodiment, the base layer BSL is flexible and provides a rear surface of the display module 100. The pixel layer PXL includes a plurality of pixels and is driven by receiving electrical signals to generate the images IM. The protective layer PTL protects the pixel layer PXL, and the touch sensing unit 120 is disposed on the protective layer PTL. The protective layer PTL has a multilayer structure and includes an organic insulating film or an inorganic insulating film.

According to an embodiment, a window is further provided on the touch sensing unit 120. The window covers and protects the display module 100. The window is made of a transparent material. The window may include plastic and, in this case, the window is flexible.

Examples of a plastic suitable for the window include polyimide, polyacrylate, polymethylmethacrylate (PMMA), polycarbonate (PC), polyethylene naphthalate (PEN), polyvinylidene chloride, polyvinylidene difluoride (PVDF), polystyrene, ethylene vinyl alcohol copolymer, polyethersulphone (PES), polyetherimide (PEI), polyphenylene sulfide (PPS), polyarylate tri-acetyl cellulose (TAC), or cellulose acetate propionate (CAP), etc., but embodiments of the present disclosure are not limited thereto. According to an embodiment, the window can include one or more of the plastic materials listed above.

Figure 4:
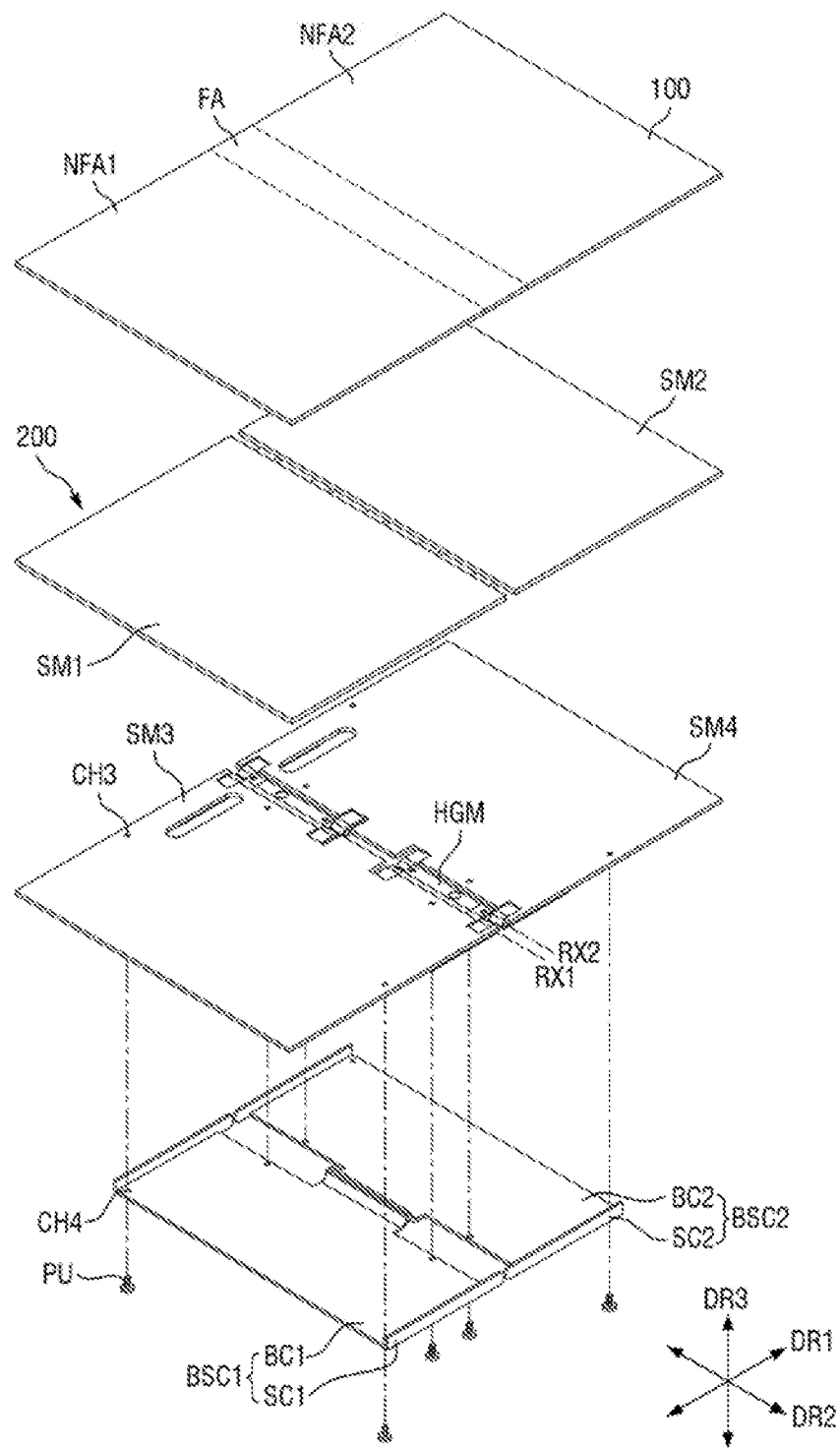
FIGS. 4 and 5 are exploded perspective views of a display device shown in FIG. 1.
Figure 5:
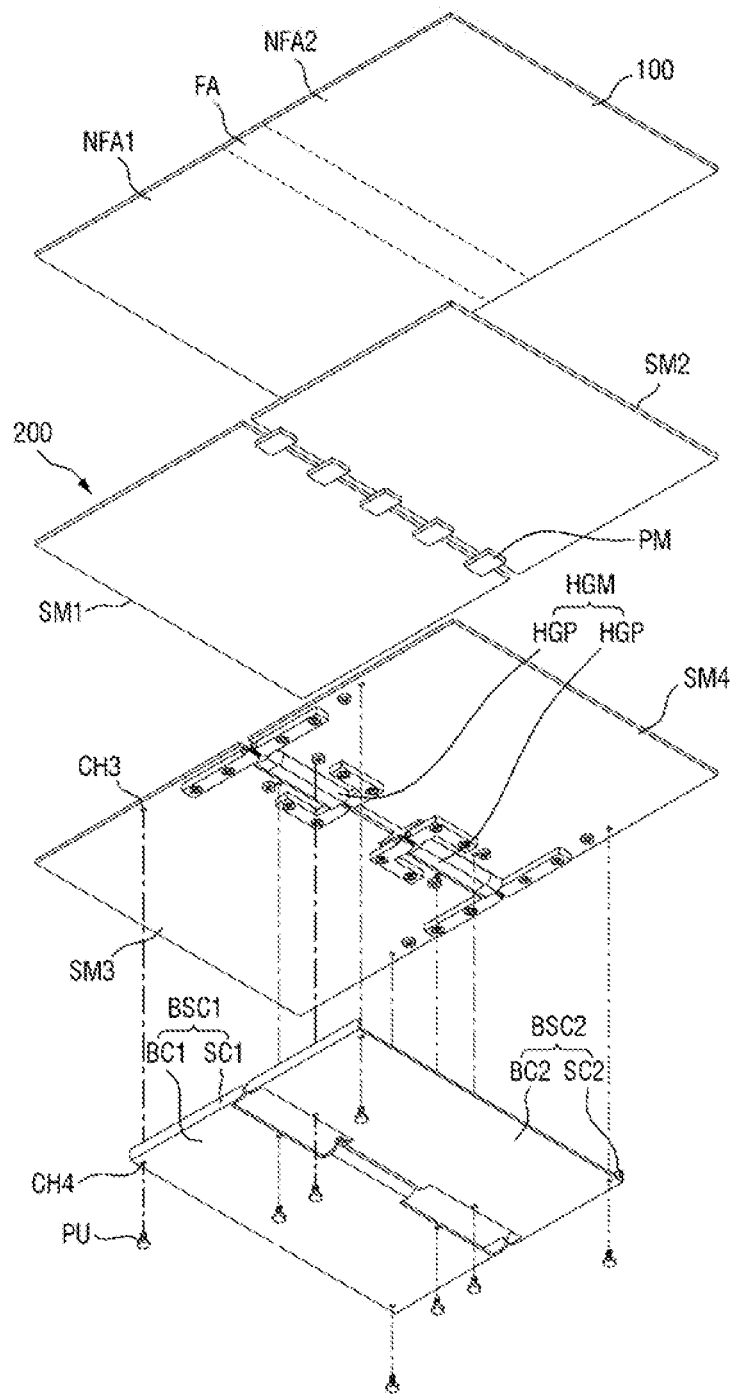

FIGS. 4 and 5 are exploded perspective views of a display device shown in FIG. 1.

FIG. 4 is an exploded perspective view of an upper portion of the display device 1000, and FIG. 5 is an exploded perspective view of a lower portion of the display device 1000.

Referring to FIGS. 4 and 5, according to an embodiment, the display device 1000 includes a display module 100 and a foldable member 200. The foldable member 200 includes a first support member SM1, a second support member SM2, a third support member SM3, a fourth support member SM4, a hinge member HGM, a first back surface cover BSC1, and a second back surface cover BSC2.

According to an embodiment, the first, and second support members SM1 and SM2 are arranged in a first direction DR1, and the display module 100 is disposed on the first and second support members SM1 and SM2.

According to an embodiment, a planarization member PM is disposed that overlaps one side of a lower surface of the first support member SM1 and one side of a lower surface of the second support member SM2. The planarization member PM is made of a magnetic material, fixed to one side of the lower surface of the first support member SM1, and detachably coupled to one side of the lower surface of the second support member SM2. The planarization member PM will be described in detail with reference to FIGS. 6 to 9.

According to an embodiment, one side of the first support member SM1 and one side of the second support member SM2 face each other. A foldable region FA of the display module 100 is disposed above a gap between the first and second support members, and non-foldable regions NFA1 and NFA2 of the display module 100 are disposed on upper surfaces of the first and second support members, respectively.

According to an embodiment, the third and fourth support members SM3 and SM4 are arranged in the first direction DR1. The third support member SM3 is disposed below the first support member SM1 and the fourth support member SM4 is disposed below the second support member SM2.

According to an embodiment, the hinge member HGM overlaps the gap between the first and second support members and is disposed between the third support member SM3 and the fourth support member SM4. The hinge member HGM is connected to one side of the third support member SM3 and one side of the fourth support member SM4 that face each other in the first direction DR1. The hinge member HGM provides a rotation axis to each of one side of the third support member SM3 and one side of the fourth support member SM4. Rotation axes RX1 and RX2 include a first rotation axis RX1 provided at one side of the third support member SM3 and a second rotation axis RX2 provided at one side of the fourth support member SM4.

According to an embodiment, the hinge member HGM includes a plurality of hinge portions HGP which are spaced apart in a second direction DR2 and disposed between the third support member SM3 and the fourth support member SM4. For example, the hinge member HGM includes two hinge portions HGP, but the number of hinge portions HGP is not limited thereto. For example, in other embodiments, the hinge member HGM includes one hinge portion HGP or includes more than two hinge portions HGP.

Figure 10:
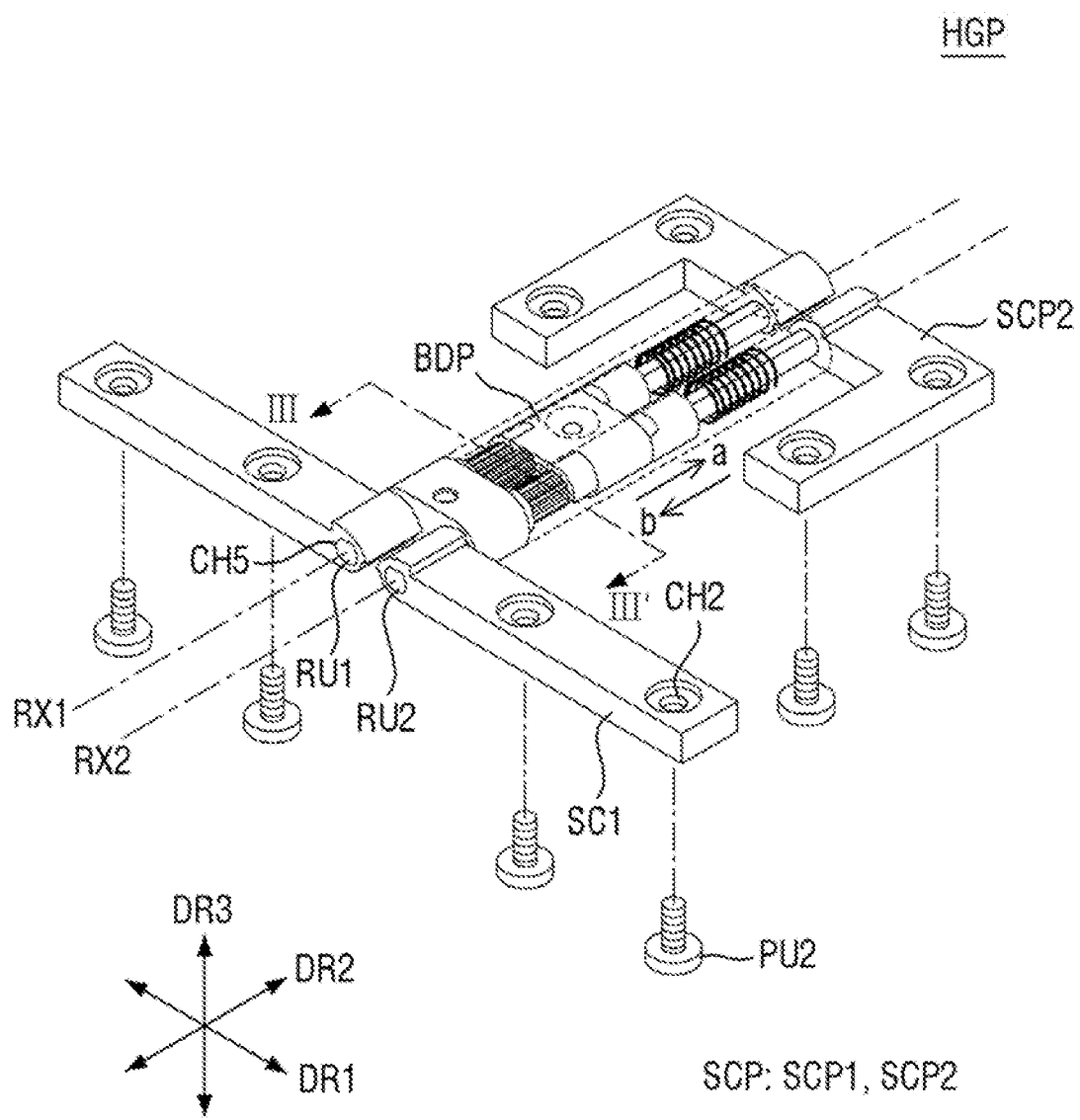
FIG. 10 illustrates a body portion of a hinge portion shown in FIGS. 4 and 5 and sub connection portions disposed on a side of the hinge portion.

As shown in FIG. 10, according to an embodiment, each of the hinge portions HGP is connected to one side of the third support member SM3 and one side of the fourth support member SM4 to provide the first rotation axis RX1 to the one side of the third support member SM3 and to provide the second rotation axis RX2 to the one side of the fourth support member SM4. Each of the hinge portions HGP includes a body portion BDP that extends in the second direction DR2 and a plurality of sub connection portions SCP that extend in the first direction DR1 from opposite sides of the body portion BDP.

According to an embodiment, the body portions BDP each include a first rotation unit RU1 which provides the first rotation axis RX1 and a second rotation unit RU2 which provides the second rotation axis RX2. The first rotation unit RU1 extends in the second direct DR2 and rotates about the first rotation axis RX1, and the second rotation unit RU2 extends in the second direction DR2 and rotates about the second rotation axis RX2. A cross section of each of the first and second rotation units RU1 and RU2 has a D shape. However, embodiments of the present disclosure are not limited thereto, and in other embodiments, the cross section of each of the first and second rotation units RU1 and RU2 can have any shape as long as the first and second rotation units RU1 and RU2 and the sub connection portions SCP can be coupled to each other to simultaneously rotate. For example, in some embodiments, the cross section of each of the first and second rotation units RU1 and RU2 has a circular shape.

According to an embodiment, each of the sub connection portions SCP are connected to one of the first and second rotation units RU1 and RU2. The plurality of sub connection portions SCP include first sub connection portions SCP1 and second sub connection portions SCP2, with the body portion BDP disposed between the first sub connection portions SCP1 and the second sub connection portions SCP2. Specifically, two first and second sub connection portions SCP1 and SCP2 are disposed on each side of each body portion BDP, with one side of one sub connection portion SCP connected to the first rotation unit RU1, and one side of the other sub connection portion SCP connected to the second rotation unit RU2. Each pair of first and second sub connection portions SCP1 and SCP2 face each other in the first direction DR1.

According to an embodiment, the first sub connection portions SCP1 extend in the first direction DR1 and are connected to a lower side of the third support member SM3 and to a lower side of the fourth support member SM4. The second sub connection portions SCP2 extend in the first direction DR1 and then in the second direction DR2 toward the first sub connection portions SCP1, and are also connected to a lower side of the third support member SM3 and to a lower side of the fourth support member SM4. For example, a plurality of second pin units PU2 can be inserted into a plurality of second connection holes CH2 formed in the first and second sub connection portions SCP to be connected to the lower side of the third support member SM3 and the lower side of the fourth support member SM4.

Referring again to FIGS. 4 and 5, according to an embodiment, the first back surface cover BSC1 is disposed below the third support member SM3 and the second back surface cover BSC2 is disposed below the fourth support member SM4. The first and second back surface covers BSC1 and BSC2 are connected to the lower sides of the third and fourth support members SM3 and SM4 and cover the hinge portions HGP.

According to an embodiment, a plurality of third connection holes CH3 are formed in each of the third and fourth support members SM3 and SM4, and a plurality of fourth connection holes CH4 are formed in each of the first and second back surface covers BSC1 and BSC2.

According to an embodiment, the fourth connection holes CH4 overlap the third connection holes CH3 in one-to-one correspondence. A plurality of pin units PU are inserted into the fourth connection holes CH4 and the third connection holes CH3 that connect the first and second back surface covers BSC1 and BSC2 to the third and fourth support members SM3 and SM4, respectively.

According to an embodiment, the first back surface cover BSC1 includes a first bottom cover BC1 and two first side surface covers SC1 that extend upward from opposite sides of the first bottom cover BC1 in the second direction DR2.

According to an embodiment, the second back surface cover BSC2 has a structure that is symmetric with that of the first back surface cover BSC1. The second back surface cover BSC2 includes a second bottom cover BC2 that has a structure that is symmetric with that of the first bottom cover BC1, and second side surface covers SC2 that has a structure that is symmetric with that of the first side surface covers SC1.

According to an embodiment, the fourth connection holes CH4 are formed in the first and second bottom covers BC1 and BC2. The first and second side surface covers SC1 and SC2 cover sides of the third support member SM3 that are opposite in the second direction DR2 and cover sides of the fourth support member SM4 that are opposite in the second direction DR2. Further, the first and second side surface covers SC1 and SC2 cover a sidewall of a joint unit and the sub connection portions SCP such that the sidewall of the joint unit and the sub connection portions SCP are not visible when viewed from the second direction DR2.

Hereinafter, the planarization member PM will be described in detail with reference to FIGS. 6 to 9.

Figure 6:
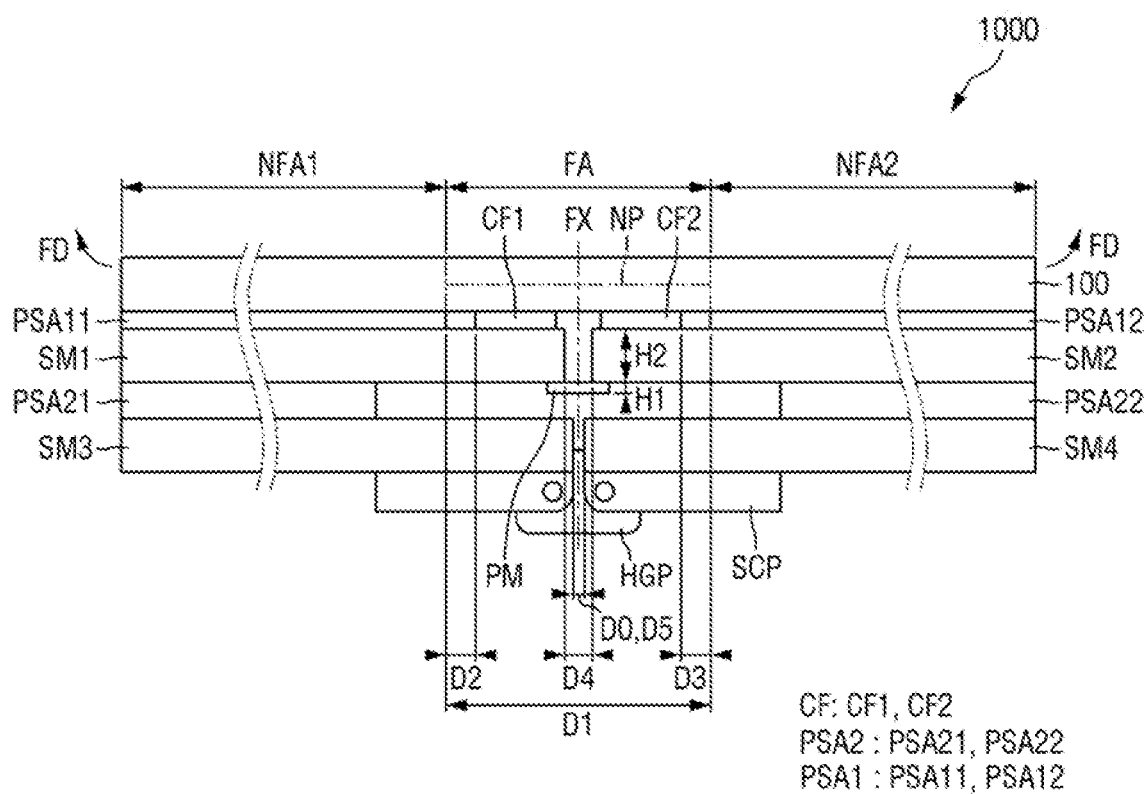
FIG. 6 is a side view of a display device shown in FIG. 4.
Figure 7:
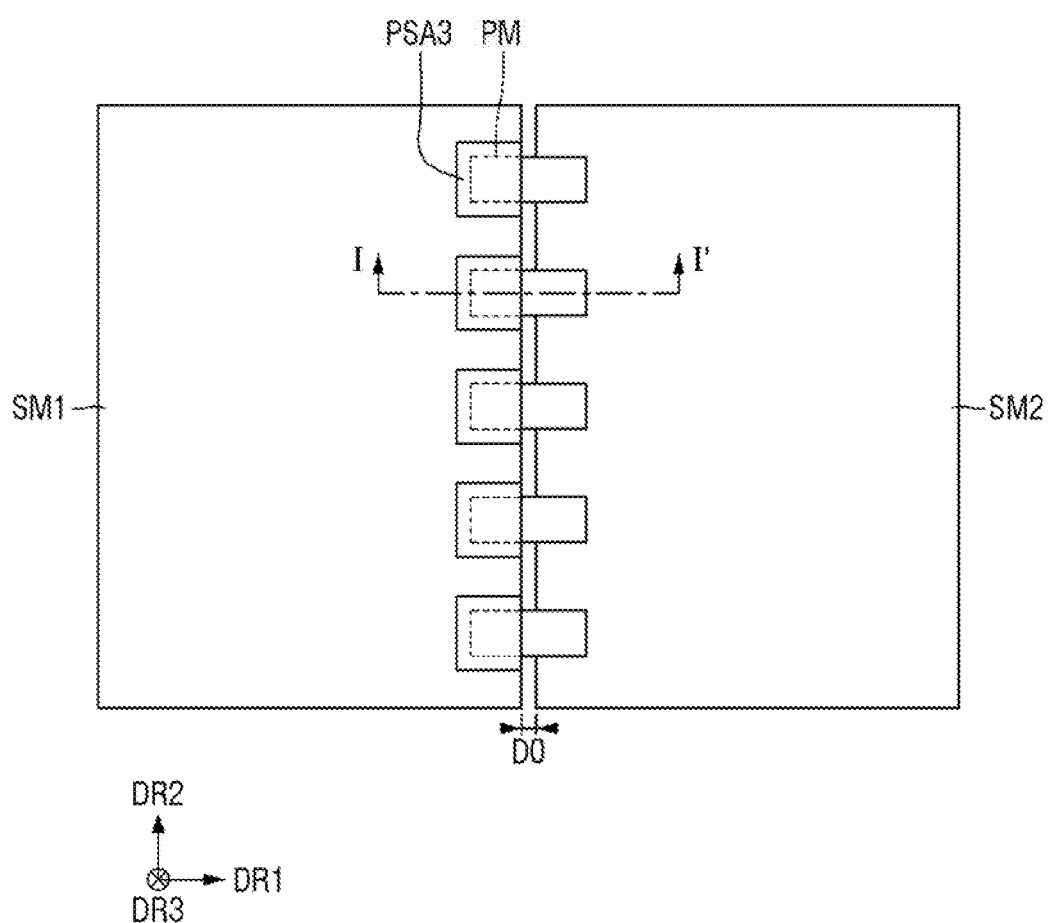
FIGS. 7 and 8 are plan views of a first support member, a second support member, and a planarization member.
Figure 8:
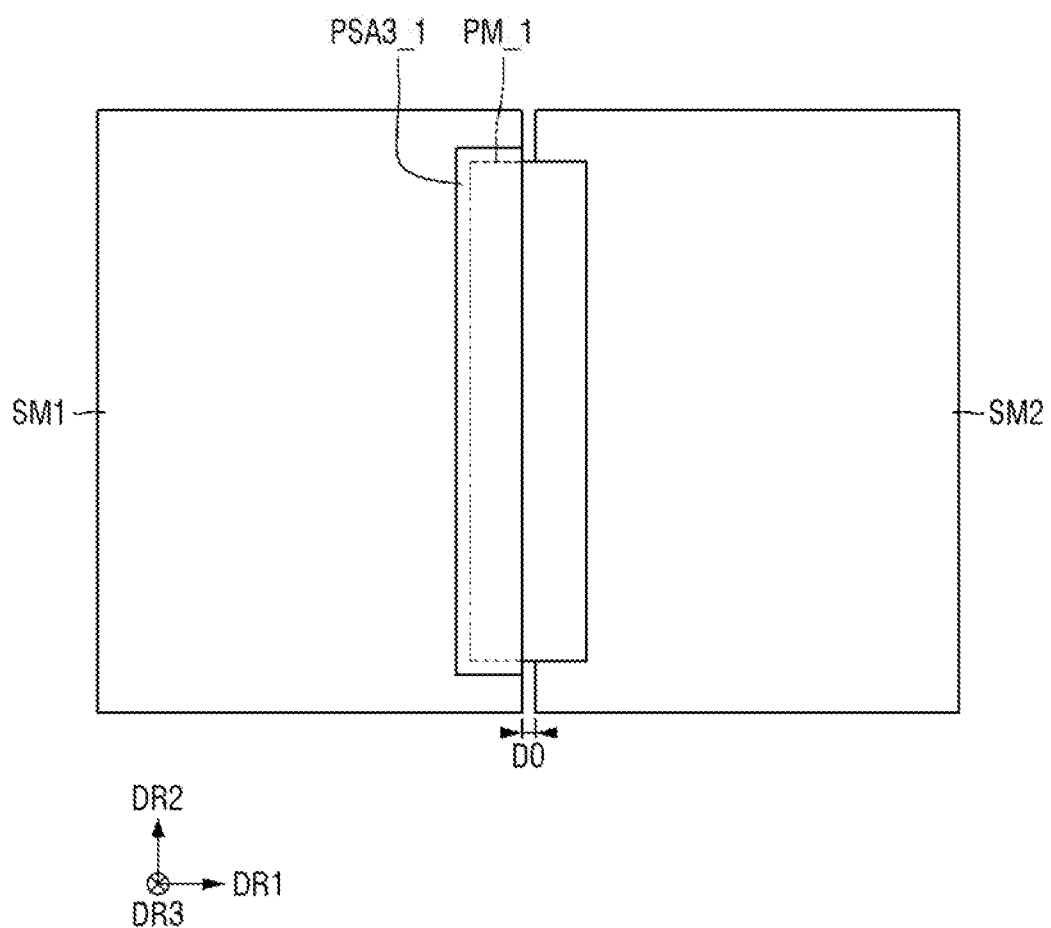
Figure 9:
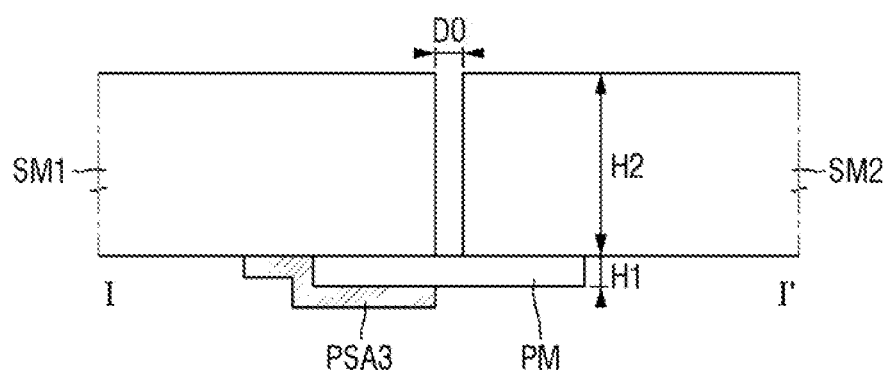
FIG. 9 is a cross-sectional view taken along line I-I' of FIG. 7.

FIG. 6 is a side view of the display device 1000 shown in FIG. 4. FIGS. 7 and 8 are plan views of the first support member SM1, the second support member SM2, and the planarization member PM. FIG. 9 is a cross-sectional view taken along line I-I' of FIG. 7.

Referring to FIGS. 6 to 9, according to an embodiment, the display device 1000 can be bent in a folding direction FD with respect to the folding axis FX. That is, the display device 1000 can switch between a folded state and an unfolded state in the folding direction FD with respect to the folding axis FX.

According to an embodiment, the first support member SM1 and the second support member SM2 overlap the display module 100 and are disposed below the display module 100. The first support member SM1 and the second support member SM2 include a metal and a magnetic material such as stainless steel (SUS).

According to an embodiment, the first support member SM1 and the second support member SM2 prevent the display module 100 from being bent due to an external force and can reduce a bending angle and a radius of bending curvature. That is, the first support member SM1 and the second support member SM2 maintain the display module 100 in a relatively flat state even when an external force is applied.

According to an embodiment, a first double-sided adhesive film PSA1 is disposed between the first and second support members SM1 and SM2 and the display module 100, and the first support member SM1 and the second support member SM2 are attached to a lower side the display module 100 using the first double-sided adhesive film PSA1.

According to an embodiment, an optical clear adhesive (OCA) or a pressure sensitive adhesive (PSA) can be used as the first double-sided adhesive film PSA1.

According to an embodiment, the first support member SM1 and the second support member SM2 are be coplanar and spaced apart from each other by a reference distance D0. For example, the reference distance D0 is 0.1 mm or less. The first and second support members SM1 and SM2 are symmetric with respect to the folding axis FX.

According to an embodiment, the first double-sided adhesive film PSA1 includes a first left double-sided adhesive film PSA11 and a first right double-sided adhesive film PSA12 that are separated from each other.

According to an embodiment, the first left double-sided adhesive film PSA11 overlaps a first non-foldable region NFA1 of the display module 100 and is disposed between the display module 100 and the first support member SM1. In this case, the first support member SM1 is coupled to the display module 100 using the first left double-sided adhesive film PSA11. Similarly, the first right double-sided adhesive film PSA12 overlaps a second non-foldable region NFA2 of the display module 100 and is disposed between the display module 100 and the second support member SM2. In this case, the second support member SM2 is coupled to the display module 100 using the first right double-sided adhesive film PSA12.

According to an embodiment, the first left double-sided adhesive film PSA11 and the first right double-sided adhesive film PSA12 are coplanar and spaced apart from each other by a first distance D1. The first distance D1 is greater than the reference distance D0. The first left double-sided adhesive film PSA11 and the first right double-sided adhesive film PSA12 are bilaterally symmetric with respect to a folding line FL.

According to an embodiment, an inner side surface of the first support member SM1 is closer to the folding line FL (or the folding axis FX) than an inner side surface of the first left double-sided adhesive PSA11, and an inner side surface of the second support member SM2 is closer to the folding line FL than an inner side surface of the first right double-sided adhesive film PSA12.

In this case, according to an embodiment, the foldable region FA and the first and second non-foldable regions NFA1 and NFA2 of the display module 100 are defined by the first left double-sided adhesive film PSA11 and the first right double-sided adhesive film PSA12. The first and second non-foldable regions NFA1 and NFA2 are regions the display module 100 that are coupled to the first and second support members SM1 and SM2 by the first and second double-sided adhesive films PSA11 and PSA12 and are regions that have a small degree of being bent by an external force and have a generally flat state. That is, the first and second non-foldable regions NFA1 and NFA2 are regions in which all of the first and second support members SM1 and SM2, the first double-sided adhesive film PSA1, and the display module 100 overlap each other and are coupled (or attached) to each other. The foldable region FA is a region of the display module 100 that is not directly coupled to (or supported by) the first support member SM1 and the second support member SM2 and has a large degree of being bent by an external force. For example, with respect to the same external force, a deformations degree, such as a pending angle, of the foldable region FA is at least three times a deformation degree of each of the first and second non-foldable regions NFA1 and NFA2. The foldable region FA can switch from a folded state to an unfolded state, or from an unfolded state to a folded state, by an external force.

According to an embodiment, the display device 1000 further includes a single-sided adhesive film CF or height compensation film.

According to an embodiment, the single-sided adhesive film CF overlaps the foldable region FA of the display module 100 and is disposed between the display module 100 and the first support member SM1 and between the display module 100 and the second support member SM2. That is, the single-sided adhesive film CF is coplanar with the first and second double-sided adhesive films PSA11 and PSA12.

According to an embodiment, the single-sided adhesive film CF has the same thickness as the first double-sided adhesive film PSA1. The single-sided adhesive film CF includes a first single-sided adhesive film CF1 and a second single-sided adhesive film CF2 that overlap the foldable region FA and are coplanar with the first left double-sided adhesive film PSA11 and the first right double-sided adhesive film PSA12.

According to an embodiment, the first single-sided adhesive film CF1 is disposed between the display module 100 and the first support member SM1. Similarly, the second single-sided adhesive film CF2 is disposed between the display module 100 and the second support member SM2. The first single-sided adhesive film CF1 and the second single-sided adhesive film CF2 are spaced apart from each other by a fourth distance D4. The fourth distance D4 is greater than or equal to the reference distance D0. For example, an inner side surface, such as a side surface adjacent to the folding line FL, of the first single-sided adhesive film CF1 is coplanar with the inner side surface of the first support member SM1. In another embodiment, the inner side surface of the first support member SM1 is closer to the folding line FL than the inner side surface of the first single-sided adhesive film CF1.

According to an embodiment, the first single-sided adhesive film CF1 is spaced apart from the first left double-sided adhesive film PSA11 by a second distance D2, and the second single-sided adhesive film CF2 is spaced apart from the first right double-sided adhesive film PSA12 by a third distance D3. Here, the second distance D2 and the third distance D3 may be the same or different from each other. For example, each of the second distance D2 and the third distance D3 may be 1 mm or less and may be substantially zero.

According to an embodiment, a lower surface of the first single-sided adhesive film CF1 is adhesive and an upper surface is not adhesive. Similarly, a lower surface of the second single-sided adhesive film CF2 is adhesive and an upper surface is not adhesive. In this case, the first single-sided adhesive film CF1 is attached to an upper surface of the first support member SM1, and the second single-sided adhesive film CF2 is attached to an upper surface of the second support member SM2. However, embodiments of the disclosure are not limited thereto, and in other embodiments, both of the upper and lower surfaces of the single-sided adhesive film CF are adhesive.

According to an embodiment, when the lower surface of the single-sided adhesive film CF is adhesive and the upper surface of the single-sided adhesive film CF is not adhesive, a horizontal position of a neutral surface NP is determined according to positions of the first left double-sided adhesive film PSA11 and the first right double-sided adhesive film PSA12, and a horizontal width of the neutral surface NP corresponds to the first distance D1 between the first left double-sided adhesive film PSA11 and the first right double-sided adhesive film PSA12.

However, when both of the upper and lower surfaces of the single-sided adhesive film CF are adhesive, the horizontal position of the neutral surface NP can be determined according to positions of the first and second support members SM1 and SM2, and the horizontal width of the neutral surface NP corresponds to the reference distance D0 between the first and second support members SM1 and SM2.

According to an embodiment, the single-sided adhesive film CF has a ductility that is substantially identical or similar to the ductility of the display module 100.

According to an embodiment, the first support member SM1 and the second support member SM2 support the display module 100 using the single-sided adhesive film CF. Therefore, a phenomenon in which the display module 100 is deformed in a manufacturing process of the foldable display device 1000 or when the foldable display device 1000 is in use can be prevented. For example, during a lamination process that attaches the first support member SM1 and the second support member SM2 to the display module 100, a phenomenon in which the display module 100 is depressed and deformed by a lamination roller in the foldable region FA can be prevented.

As described above, according to an embodiment, the first support member SM1 and the second support member SM2 are disposed below the display module 100, and thus the non-foldable regions NFA1 and NFA2 are maintained to be substantially flat. Further, the single-sided adhesive film CF is disposed between the display module 100 and the first and second support members SM1 and SM2 in the foldable region FA, and thus deformation of the display module 100 during the manufacturing process of the foldable display device 1000 or due to the use of the foldable display device 100 can be minimized. Therefore, degradation of display quality can be prevented.

According to an embodiment, the first support member SM1 includes at least one planarization member PM on one side thereof which is adjacent to the folding axis FX.

According to an embodiment, the plurality of planarization members PM have a rectangular shape with a thickness H1 in a third direction DR3 that is much less than its lengths in the first and second directions DR1 and DR2. According to an embodiment, a length of the planarization members PM in the first direction DR1 is greater than a length of the planarization members PM in the second direction DR2. According to an embodiment, die thickness H1 of the planarization member PM is less than a thickness H2 of the first and second support members SM1 and SM2 in the third direction DR3. The plurality of planarization members PM are disposed at regular intervals in the second direction DR2 on one side of a lower surface of the first support member SM1 adjacent to the folding axis FX.

According to an embodiment, one side of the planarization member PM is fixed to one side of the lower surface of the first support member SM1. According to an embodiment, the planarization member PM is fixedly attached to one side of the lower surface of the first support member SM1 adjacent to the folding axis FX by an adhesive member PSA3. According to an embodiment, the adhesive member PSA3 is a single-sided adhesive film in which at least one of upper and lower surfaces is adhesive. For example, the upper surface of the single-sided adhesive film is adhesive and the lower surface is not adhesive. In this case, as shown in FIG. 9, the adhesive member PSA3 is a base film in which at upper surface thereof is attached to a portion of a lower surface of the planarization member PM, a portion of a side surface of the planarization member PM, and a portion of the lower surface of the first support member SM1, and a lower surface thereof is not adhesive. Each of the plurality of planarization members PM is fixedly attached by an independent adhesive member PSA1.

According to an embodiment, a PSA is used as the adhesive member PSA3. The PSA may be a natural rubber adhesive, a styrene/butadiene latex adhesive, an ABA block copolymer type thermoplastic rubber, where A is a thermoplastic polystyrene end bloc, and B is an intermediate block of polyisoprene rubber, polybutadiene rubber, polyethylene rubber, or polybutylene rubber, butyl rubber, polyisobutylene, polyacrylate, acrylic polymer adhesives such as vinyl acetate or acrylic ester copolymer, or vinyl ether polymer adhesives such as polyvinyl methyl ether, polyvinyl ethyl ether, or polyvinyl isobutyl ether.

However, the shape of the planarization member PM is not limited thereto. For example, in another embodiment, as shown in FIG. 8, a planarization member PM_1 has a rectangular shape in which the length in the second direction DR2 is substantially longer than the length in the first direction DR1. In this case, the planarization member PM_1 is fixedly attached by an adhesive member PSA3_1 that fully covers a region where the planarization member PM_1 and the first support member SM1 overlap. Further, in still other embodiments, the planarization member PM is integrally formed with the first support member SM1.

According to an embodiment, the other side of the planarization member PM is detachable from one side of the lower surface of the second support member SM2 adjacent to the folding axis FX. According to an embodiment, the planarization member PM is a magnetic material. For example, the magnetic material is a permanent magnet. In this case, the magnetic material always maintains a magnetic field. As described above, the second support member SM2 includes a metal and a magnetic material such as stainless steel (SUS). Therefore, when the display device 1000 is unfolded, an attractive force due to the magnetic field acts between the other side of the planarization member PM and the second support member SM2.

According to an embodiment, the thickness H1 of the planarization member PM, the number of planarization members PM, and a size of an area of the planarization member PM that overlaps the first and second support members SM1 and SM2 can change in proportion to an area of each of the first and second support members SM1 and SM2. For example, as the area of each of the first and second support members SM1 and SM2 increases, the thickness H1 of the planarization member PM may increase, and the number of planarization members PM and the size of the overlap area of the planarization member PM with the first and second support members SM1 and SM2 also increases.

In addition, according to an embodiment, the thickness H1 of the planarization member PM, the number of planarization members PM, and the size of the overlap area of the planarization member PM with the first and second support members SM1 and SM2 changes in proportion to the thickness H2 and a modulus of each of the first and second support members SM1 and SM2. For example, as the thickness H2 and the modulus of each of the first and second support members SM1 and SM2 increases, the thickness H1 of the planarization member PM increases, and the number of planarization members PM and the size of the overlap area of the planarization member PM with the first and second support members SM1 and SM2 also increases.

According to an embodiment, in the region of the planarization member PM that overlaps the foldable region FA of the display module 100, the planarization members PM is disposed on the lower surfaces of the first support member SM1 and the second support member SM2. That is, the lower surfaces of the first and second support members SM1 and SM2 are in direct contact with the upper surfaces of the planarization members PM, and thus the lower surfaces of the first and second support members SM1 and SM2 are located on the same reference surface. Therefore, no step is generated in the third direction DR3 between the first support member SM1 and the second support member SM2.

Further, according to an embodiment, since an attractive force is present between the magnetic planarization member PM and the metallic second support member SM2, a phenomenon in which a gap is generated between the planarization member PM and the second support member SM2 can be prevented. Therefore, when the display device 1000 is unfolded, the unfolded state can be maintained.

According to an embodiment, the third support member SM3 and the fourth support member SM4 overlap the first support member SM1 and the second support member SM2, respectively, and are disposed below the first support member SM1 and the second support member SM2, respectively. The third support member SM3 and the fourth support member SM4 can be rotated by a hinge member HGM, and a coupling angle between the third support member SM3 and the fourth support member SM4 changes. However, the shapes of the third support member SM3 and the fourth support member SM4 themselves are not deformed.

According to an embodiment, the third support member SM3 and the fourth support member SM4 each include a non-magnetic metal, such as aluminum, or polymers, such as PMMA, PC, polyvinylalcohol (PVA), acrylonitrile-butadiene-styrene (ABS), or polyethylene terephthalate (PET).

According to an embodiment, a second double-sided adhesive film PSA2 includes a second left double-sided adhesive film PSA21 and a second right double-sided adhesive film PSA22. The second left double-sided adhesive film PSA21 is disposed between the first support member SM1 and the third support member SM3, and the second right double-sided adhesive, film PSA22 is disposed between the second support member SM2 and the fourth support member SM4. Through the second double-sided adhesive film PSA2, the third support member SM3 is attached to the first support member SM1 and the fourth support member SM4 is attached to the third support member SM3.

According to an embodiment, the third support member SM3 and the fourth support member SM4 are coplanar and are spaced apart from each other by a reference distance D5. For example, the reference distance D5 is 0.1 mm or less. The third and fourth support members SM3 and SM4 are symmetric with respect to the folding axis FX. According to an embodiment, the reference distance D5 between the third support member SM3 and the fourth support member SM4 is equal to the reference distance D0 between the first support member SM1 and the second support member SM2. However, embodiments of the present disclosure are not limited thereto, and in other embodiments, the reference distance D5 between the third and fourth support members SM3 and SM4 is greater than the reference distance D0 between the first and second support members SM1 and SM2.

According to an embodiment, the second double-sided adhesive film PSA2 is a spacer tape. Here, the spacer tape may include a buffer member, a first adhesive layer disposed on one surface of the buffer member and that adheres the buffer member to the first and second support members SM1 and SM2, and a second adhesive layer disposed on the other surface of the buffer member and that adheres the buffer member to the third and fourth support member members SM3 and SM4.

According to an embodiment, the second double-sided adhesive film PSA2 has a thickness sufficient to secure a space for rotating the planarization member PM fixedly coupled to one side of the lower surface of the first support member SM1 when the display device 1000 is folded.

Figure 11:
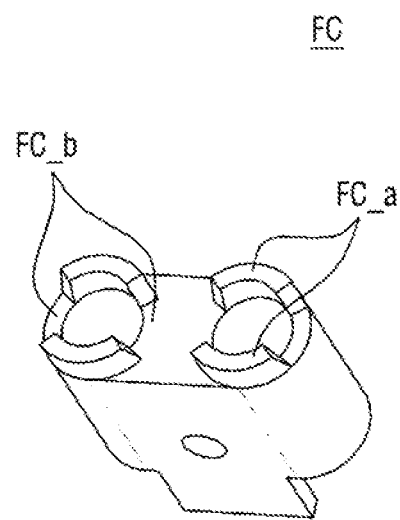
FIG. 11 is a perspective view of a fixing cam according to an embodiment.
Figure 12:
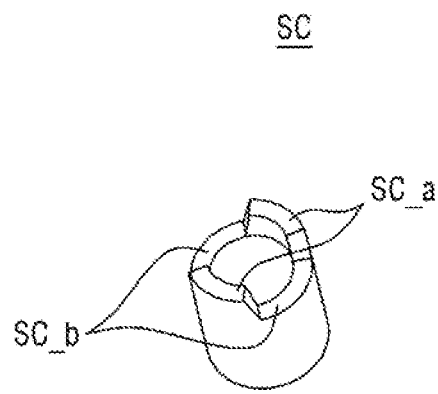
FIG. 12 is a perspective view of a rotary cam according to an embodiment.
Figure 13:
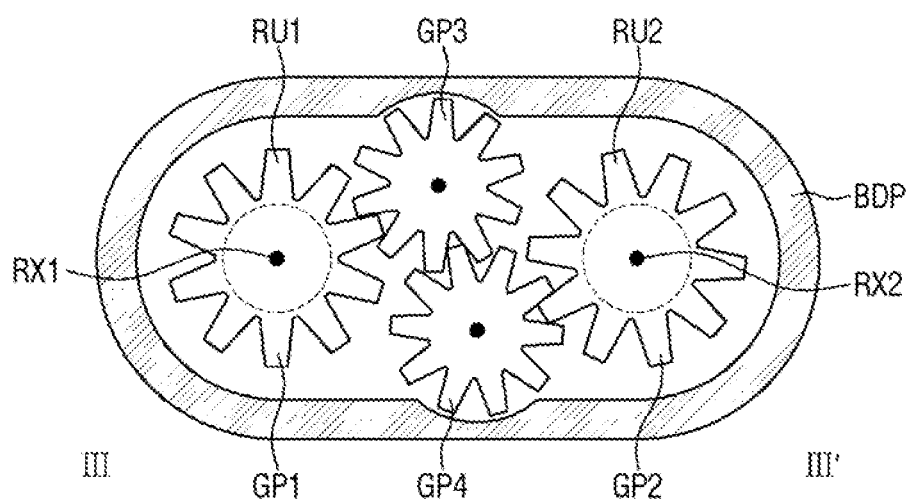
FIG. 13 is a cross-sectional view taken along line III-III' in FIG. 10.

FIG. 10 is a illustrates a body portion of a hinge portion shown in FIGS. 4 and 5 and sub connection portions disposed on the side of the hinge portion. FIG. 11 is a perspective view of a fixing cam. FIG. 12 is a perspective view of a rotary cam. FIG. 13 is a cross-sectional view taken along line III-III' in FIG. 10.

Referring to FIGS. 10 to 13, according to an embodiment, a first rotation unit RU1 and a second rotation unit RU2 extend in a second direction DR2 and can be rotated about a first rotation axis RX1 and a second rotation axis RX2, respectively. A first gear portion GP1 that provides the first rotation axis RX1, a second gear portion GP2 that provides the second rotation axis RX2, and a third gear portion GP3 and a fourth gear portion GP4 disposed between the first gear portion GP1 and the second gear portion GP2 are disposed in a body portion BDP.

Referring to FIGS. 10, 11, and 12, according to an embodiment, one side of a fixing cam FC is fixed to the body portion BDP, and the other side includes ridge portions FC_a disposed on upper and lower surfaces of the fixing cam FC and valley portions FC_b disposed on left and right surfaces of the fixing cam FC. Directions in which the ridge portions FC_a and the valley portions FC_b are formed are based on an angle in which the foldable member 200 opens or closes. A rotary cam SC includes valley portions SC_b that engage with the ridge portions FC_a of the fixing cam FC to allow sliding surface contact. Therefore, ridge portions SC_a are formed at both sides of the valley portion SC_b. An elastic member is provided at one side of the rotary cam SC that can be pressed against the fixing cam FC and the rotary cam SC. The elastic member may be, for example, a compression coil spring.

According to an embodiment, in an operation in which a user folds the foldable member 200, the ridge portion SC_a of the rotary cam SC gradually rotates toward a peak of the ridge portion FC_a of the fixing cam FC, and the rotary cam moves in a direction of an arrow a. When the ridge portion SC_a of the rotary cam SC passes through the peak of the ridge portion FC_a of the fixing cam FC, the rotary cam rotates while moving in a direction of an arrow b by a force of the elastic member, and the foldable member 200 automatically folds even when the user no longer applies force.

According to an embodiment, although shown as a cross section in FIG. 13, the first, second, third, and fourth gear portions GP1, GP2, GP3, and GP4 extend in the second direction DR2 like the first and second rotation units RU1 and RU2. When viewed from the second direction DR2, an outer circumferential surface of each of the first, second, third, and fourth gear portions GP1, GP2, GP3, and GP4 has a gear shape, and the first, second, third, and fourth gear portions GP1, GP2, GP3, and GP4 are engaged with each other.

According to an embodiment, the first gear portion GP1 is collinear and connected with the first rotation unit RU1. The first rotation axis RX1 extends in the second direction DR2 and forms a central axis of the first rotation unit RU1 and the first gear portion GP1. The second gear portion GP2 is collinear and connected with the second rotation unit RU2. The second rotation axis RX2 extends in the second direction DR2 and forms a central axis of the second rotation unit RU2 and the second gear portion GP2.

According to an embodiment, a fifth connection hole CH5 that extends in the second direction DR2 is formed in one side of each of the sub connection portions SCP. Each of the first and second rotation units RU1 and RU2 is inserted into the fifth connection holes CH5 of the sub connection portions SCP so that the sub connection portions SCP are connected to the first and second rotation units RU1 and RU2. The first rotation unit RU1 and the first gear portion GP1 rotate about the first rotation axis RX1, and the second rotation unit RU2 and the second gear portion GP2 rotate about the second rotation axis RX2.

According to an embodiment, the third gear portion GP3 and the fourth gear portion GP4 disposed between the first gear portion GP1 and the second gear portion GP2 are idle gears that perform two-axis rotation control by connecting two gear portions. That is, the third gear portion GP3 and the fourth gear portion GP4 respectively engage with the first gear portion GP1 and the second gear portion GP2 and allow the first gear portion GP1 and the second gear portion GP2 to simultaneously rotate instead of independently rotating. Therefore, the third support member SM3 and the fourth support member SM4 that are respectively connected to the first gear portion GP1 and the second gear portion GP2 can be folded or unfolded symmetrically.

Hereinafter, another embodiment of the display device will be described. In a following embodiment, the components that are the same as an above-described embodiment will be omitted or simplified, and differences between a following embodiment and an above-described embodiment will be mainly described.

Figure 14:
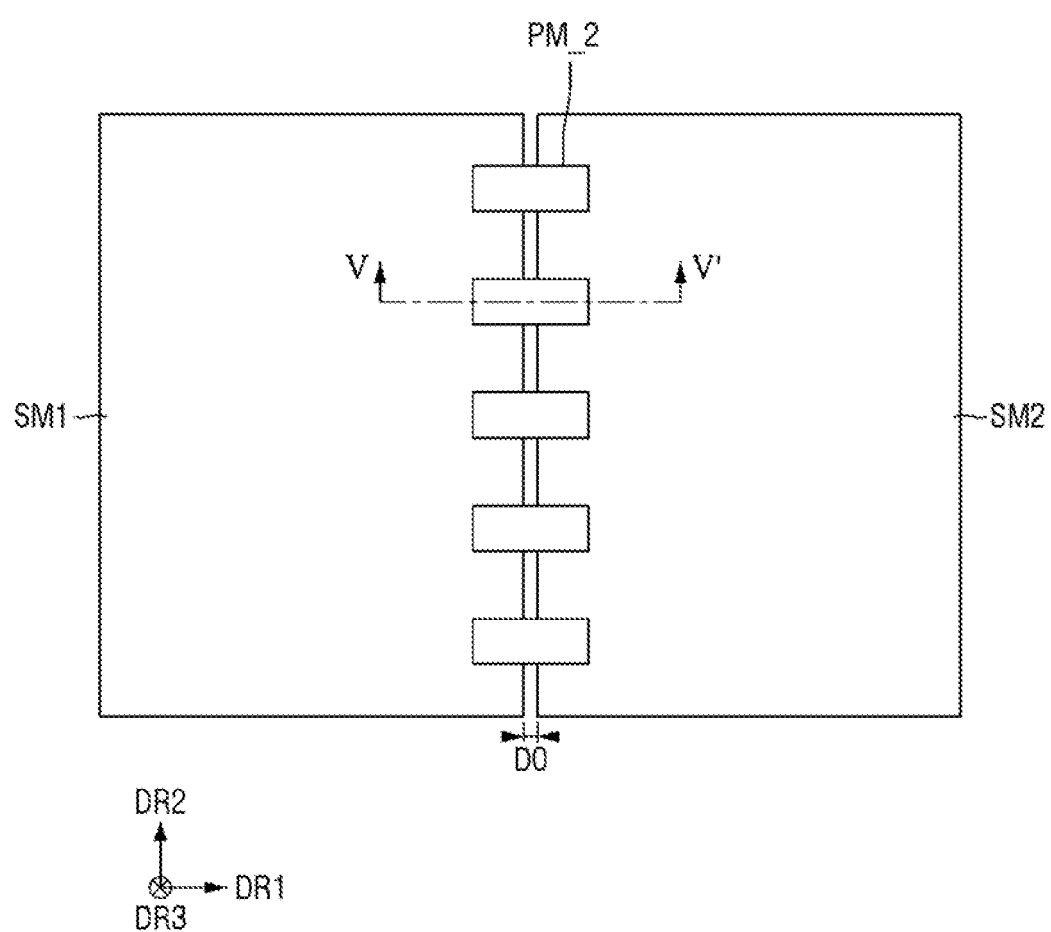
FIG. 14 is a plan view of a first support member, a second support member, and a planarization member according to another embodiment.
Figure 15:
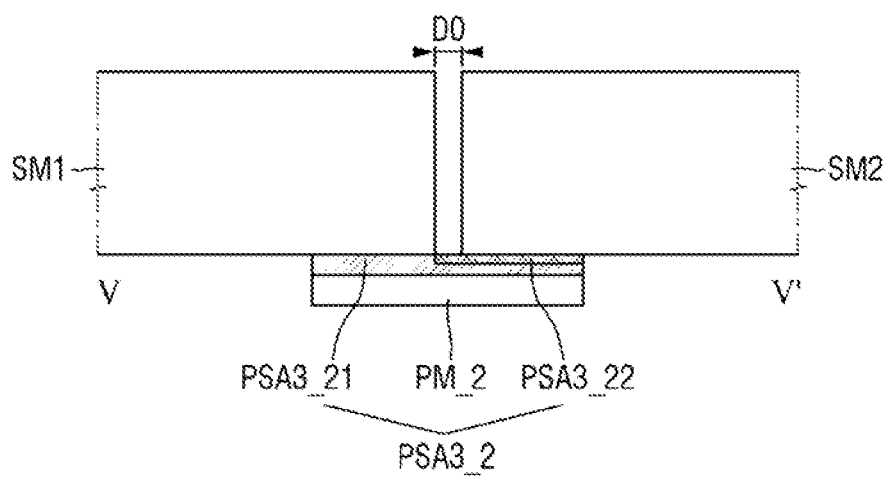
FIG. 15 is a cross-sectional view taken along line V-V' of FIG. 14.

FIG. 14 is a plan view of a first support member, a second support member, and a planarization member according to another embodiment. FIG. 15 is a cross-sectional view taken along line V-V' of FIG. 14.

Referring to FIGS. 14 and 15, according to an embodiment, an embodiment differs from an embodiment shown in FIG. 7 in that an adhesive member PSA3_2 disposed between first and second support members SM1 and SM2 and a planarization member PM_2 is a double-sided adhesive film.

More specifically, according to an embodiment, the first support member SM1 includes at least one planarization member PM_2 on a side that is adjacent to a folding axis FX.

According to an embodiment, the plurality of planarization members PM_2 have a rectangular shape with a thickness H1 in a third direction DR3 that is much less than its lengths in the first and second directions DR1 and DR2. According to an embodiment, a length of the planarization members PM in the first direction DR1 is greater than a length of the planarization members PM in the second direction DR2. The plurality of planarization members PM_2 are disposed at regular intervals in the second direction DR2 on one side of a lower surface of the first support member SM1 adjacent to the folding axis FX.

According to an embodiment, one side of the planarization member PM_2 is fixed to one side of the lower surface of the first support member SM1. According to an embodiment, the planarization member PM_2 is fixedly attached to one side of the lower surface of the first support member SM1 adjacent to the folding axis FX by the adhesive member PSA3_2. According to an embodiment, the adhesive member PSA3_2 is a double-sided adhesive film in which both of upper and lower surfaces are adhesive. The adhesive member PSA3_2 is disposed between the first and second support members SM1 and SM2 and the planarization member PM_2.

According to an embodiment, the adhesive member PSA3_2 includes a first adhesive member PSA3_2 and a second adhesive member PSA3_22. An upper surface of the first adhesive member PSA3_21 is disposed in a region in which the first support member SM1 and the planarization member PM_2 overlap and is attached to a portion of the lower surface of the first support member SM1, and a lower surface of the first adhesive member PSA3_21 is attached to an upper surface of the planarization member PM_2. Each of the plurality of planarization members PM is fixedly attached by an independent first adhesive member PSA3_21.

According to an embodiment, an upper surface of the second adhesive member PSA3_22 is disposed in a space between the first support member SM1 and the second support member SM2 and in a region in which the second support member SM2 and the planarization member PM_2 overlap and is not adhesive, and a lower surface of the second adhesive member PSA3_22 is attached to a portion of the upper surface of the planarization member PM_2. According to an embodiment, the upper surface of the second adhesive member PSA3_22 disposed in the space between the first support member SM1 and the second support member SM2 and in the overlap region of the second support member SM2 and the planarization member PM_2 is processed to have zero adhesive force by fluorine-based coating or ultraviolet (UV) light irradiation. A portion of the first adhesive member PSA3_21 extends between the planarization member PM_2 and the second adhesive member PSA3_22 in a region that overlaps the space between the first support member SM1 and the second support member SM2 and where the second support member SM2 and the planarization member PM_2 overlap. The upper surface of the first adhesive member PSA3_21 is attached to the lower surface of the second adhesive member PSA3_22.

According to an embodiment, the other side of the planarization member PM_2 can be detached from one side of a lower surface of the second support member SM2 adjacent to the folding axis FX. According to an embodiment, the planarization member PM_2 is a magnetic material. For example, the magnetic material is a permanent magnet. In this case, the magnetic material always maintains a magnetic field. As described above, the second support member SM2 includes a metal and a magnetic material such as stainless steel (SUS). Therefore, when the display device 1000 is unfolded, an attractive force due to the magnetic field acts between the other side of the planarization member PM_2 and the second support member SM2.

According to an embodiment, the lower surfaces of the first and second support members SM1 and SM2 are disposed on the upper surface of the planarization member PM_2 via the adhesive member PSA3_2 so that the lower surfaces of the first and second support members SM1 and SM2 are located on the same reference surface. Therefore, no step is generated in the third direction DR3 between the first support member SM1 and the second support member SM2.

Further, according to an embodiment, since an attractive force is present between the magnetic planarization member PM_2 and the metallic second support member SM2, a phenomenon in which a gap is generated between the planarization member PM_2 and the second support member SM2 can be prevented. Therefore, when the display device 1000 is unfolded, the unfolded state can be maintained. Furthermore, due to the adhesive member PSA3_2 disposed between the second support member SM2 and the planarization member PM_2, the second support member SM2 and the planarization member PM_2 can easily disconnect when the display device 1000 is folded.

Figure 16:
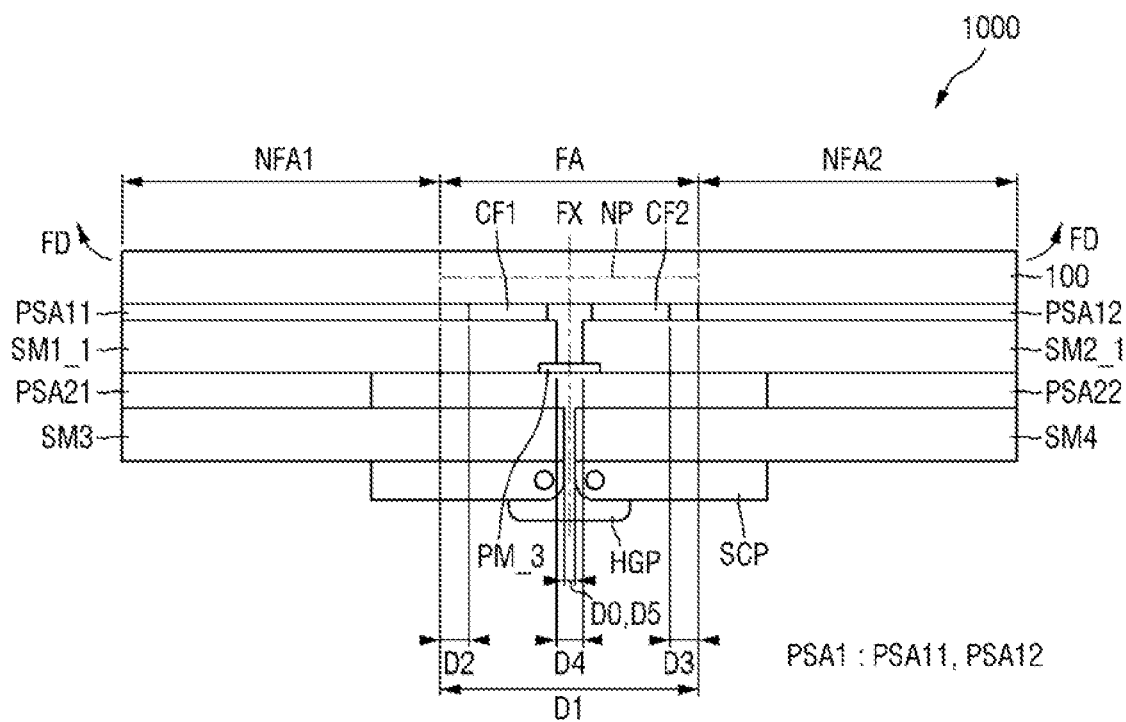
FIG. 16 is a side view of a display device shown in FIG. 4 according to still another embodiment.
Figure 17:
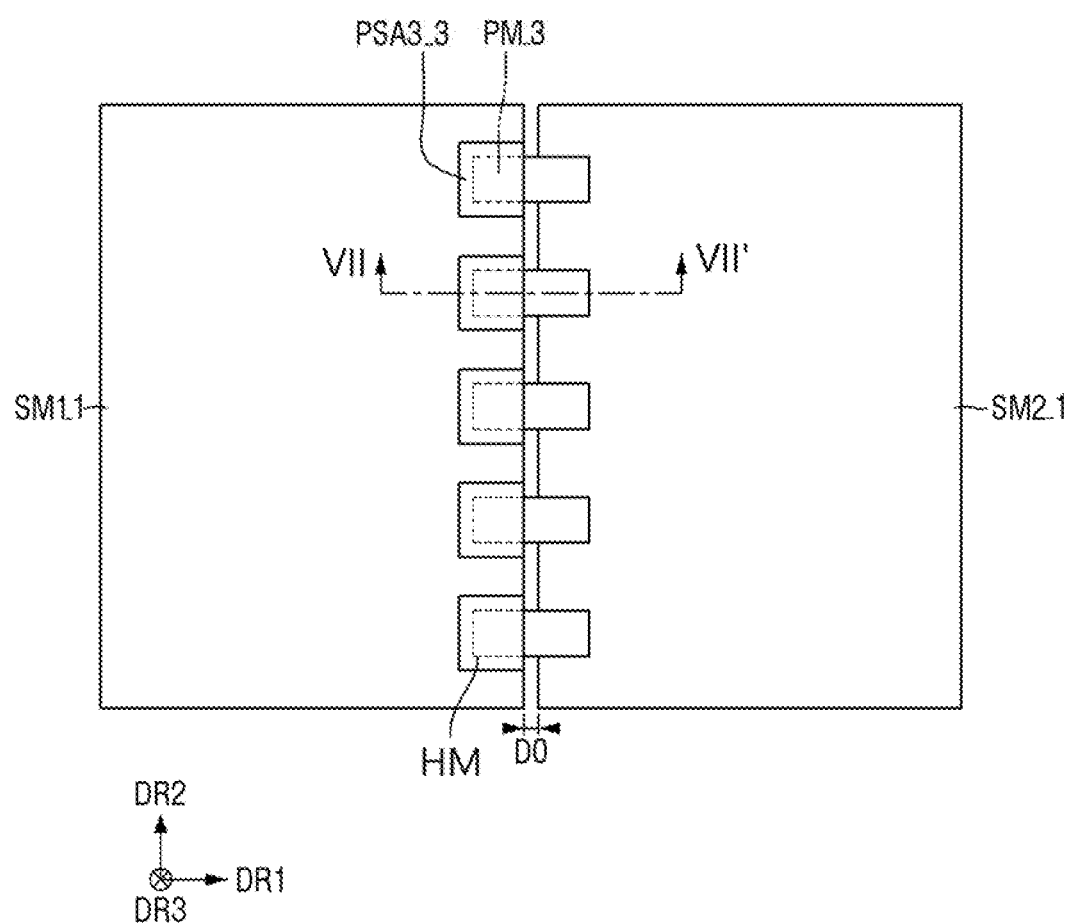
FIG. 17 is a plan view of a first support member, a second support member, and a planarization member according to still another embodiment.
Figure 18:
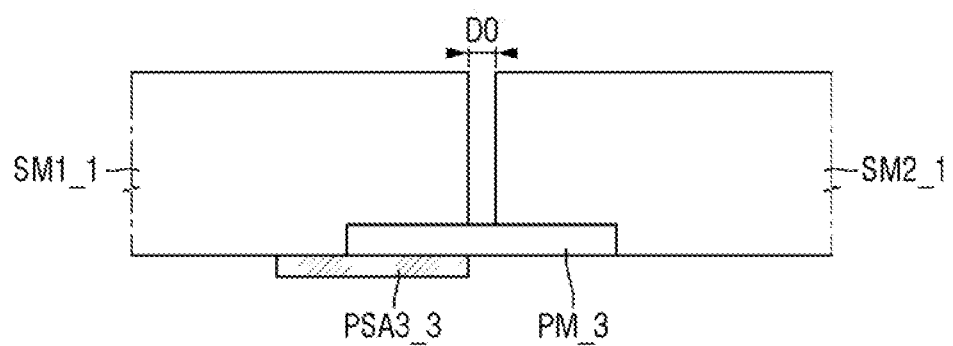
FIG. 18 is a cross-sectional view taken along line VII-VII' of FIG. 17.

FIG. 16 is a side view of the display device 1000 shown in FIG. 4 according to still another embodiment. FIG. 17 is a plan view of a first support member, a second support member, and a planarization member. FIG. 18 is a cross-sectional view taken along line VII-VII' of FIG. 17.

Referring to FIGS. 16 to 18, an embodiment differs from an embodiment shown in FIG. 6 in that a planarization member PM_3 is inserted into a first support member SM1_1 and a second support member SM2_1.

More specifically, according to an embodiment, the first support member SM1_1 include at least one planarization member PM_3 on one side thereof that is adjacent to a folding axis FX.

According to an embodiment, each of the first support member SM1_1 and the second support member SM2_1 include a plurality of grooves HM formed at regular intervals in the second direction DR2 on sides that face each other with respect to the folding axis FX. Here, the grooves HM are recessed regions on one of upper and lower surfaces thereof that have a constant depth that does not exceed a thickness H2 in the third direction DR3 of the first and second support members SM1_1 and SM2_1, instead of holes passing through upper and lower surfaces of the first and second support members SM1_1 and SM2_1. According to an embodiment, ignoring the distance D0 between the first support member SM1_1 and the second support member SM2_1, a shape of the groove HM in a plan view is substantially the same as that of the planarization member PM_3. A depth of the groove HM in the third direction DR3 is substantially the same as a thickness H1 of the planarization member PM_3. However, embodiments of the present disclosure are not limited thereto, and in other embodiments, the size of the groove HM in a plan view is greater than that of the planarization member PM_3 to provide a process margin and a use margin.

According to an embodiment, the plurality of planarization members PM_3 have a rectangular shape with a thickness H1 in the third direction DR3 that is much less than its lengths in the first and second directions DR1 and DR2. According to an embodiment, a length of the planarization members PM_3 in the first direction DR1 is greater than a length of the planarization members PM_3 in the second direction DR2. The plurality of planarization members PM_3 are inserted into the grooves HM, which are formed in one side of the first support member SM1_1 adjacent to the folding axis FX, and disposed at regular intervals in the second direction DR2.

According to an embodiment, one side of each of the plurality of planarization members PM_3 is fixed to the plurality of grooves HM formed in the first support member SM1_1. According to an embodiment, the planarization members PM_3 are fixedly attached to the grooves HM formed in the first support member SM1_1 adjacent to the folding axis FX by an adhesive member PSA3_3. According to an embodiment, the adhesive member PSA3_3 is a single-sided adhesive film in which at least one of upper and lower surfaces is adhesive. For example, the upper surface of the single-sided adhesive film is adhesive while the lower surface is not adhesive. In this case, the adhesive member PSA3_3 is a base film in which an upper surface thereof is attached to a portion of the lower surface of the planarization member PM_3 and a portion of the lower surface of the first support member SM1_1 and a lower surface thereof is not adhesive. Each of the plurality of planarization members PM_3 is fixedly attached by an independent adhesive member PSA3_3.

According to an embodiment, a PSA is used as the adhesive member PSA3_3. The PSA may be a natural rubber adhesive, a styrene/butadiene latex adhesive, an ABA block copolymer type thermoplastic rubber, where A is a thermoplastic polystyrene end block, and B is an intermediate block of polyisoprene rubber, polybutadiene rubber, polyethylene rubber, or polybutylene rubber, butyl rubber, polyisobutylene, polyacrylate, acrylic polymer adhesives, such as vinyl acetate or acrylic ester copolymer, or vinyl ether polymer adhesives, such as polyvinyl methyl ether, polyvinyl ethyl ether, or polyvinyl isobutyl ether.

According to an embodiment, the other side of the planarization member PM_3 detachably disposed in the groove HM formed in the second support member SM2_1 adjacent to the folding axis FX. According to an embodiment, the planarization member PM_3 is a magnetic material. For example, the magnetic material is a permanent magnet. In this case, the magnetic material always maintains a magnetic field. As described above, the second support member SM2_1 includes a metal and a magnetic material such as stainless steel (SUS). Therefore, when the display device 1000 is unfolded, an attractive force due to the magnetic field acts between the other side of the planarization member PM_3 and the second support member SM2_1.

According to an embodiment, the thickness H1 of the planarization member PM_3, the number of planarization members PM_3, and a size of an overlap area of planarization members PM_3 and the first and second support members SM1_1 and SM2_1 change in proportion to an area of each of the first and second support members SM1_1 and SM2_1. For example, as the area of each of the first and second support members SM1_1 and SM2_1 increases, the thickness H1 of the planarization member PM_3 increases, and the number of planarization members PM_3 and the size of the overlap area of planarization members PM_3 and the first and second support members SM1_1 and SM2_1 also increases.

In addition, according to an embodiment, the number of planarization members PM_3 and the size of the overlap area of planarization members PM_3 and the first and second support members SM1_1 and SM2_1 changes in proportion to a thickness H2 and a modulus of each of the first and second support members SM1_1 and SM2_1. For example, as the thickness H2 and the modulus of each of the first and second support members SM1_1 and SM2_1 increases, the thickness H1 of the planarization member PM_3 increases, and the number of planarization members PM_3 and the size of the overlap area of planarization members PM_3 and the first and second support members SM1_1 and SM2_1 also increases.

According to an embodiment, in the overlap region of the planarization member PM_3 with the foldable region FA of the display module 100, the planarization members PM_3 are disposed in the grooves HM formed in the first support member SM1_1 and the second support member SM2_1. That is, one surface of the grooves HM formed in each of the first and second support members SM1_1 and SM2_1 is disposed in direct contact with the upper surfaces of the planarization members PM_3, and thus the one surface of the grooves HM formed in each of the first and second support members SM1_1 and SM2_1 is located on the same reference surface. Therefore, no step is generated in the third direction DR3 between the first support member SM1_1 and the second support member SM2_1. Furthermore, the plurality of planarization members PM_3 are inserted into the grooves HM formed in the first and second support members SM1_1 and SM2_1 so that the first support member SM1_1 and the second support member SM2_1 are arranged in the first and second directions DR1 and DR2.

Further, since an attractive force is present between the magnetic planarization member PM_3 and the metallic second support member SM2_1, no gap is generated between the planarization member PM_3 and the second support member SM2_1. Therefore, when the display device 1000 is unfolded, the unfolded state is maintained. Since an attractive force due to the magnetic field is generated not only between the upper surface and side surfaces of the planarization members PM_3 but also between inner side surfaces of the grooves HM in the first and second support members SM1_1 and SM2_1, the unfolded state can be better maintained.

Figure 19:
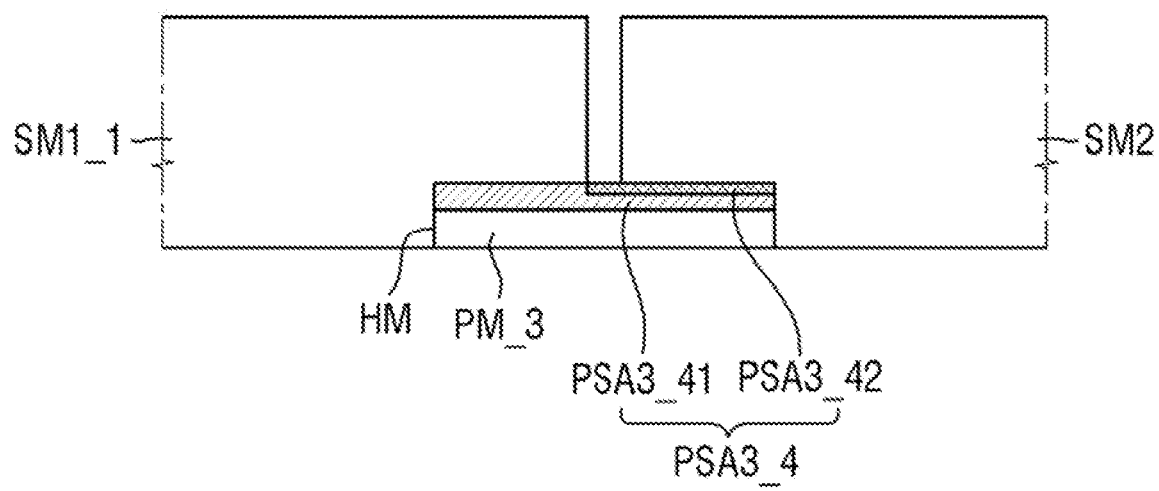
FIG. 19 is a cross-sectional view of a planarization member of FIG. 16 according to yet another embodiment.

FIG. 19 is a cross-sectional view of the planarization member of FIG. 16 according to yet another embodiment.

Referring to FIG. 19, an embodiment differs from an embodiment shown in FIG. 18 in that an adhesive member PSA3_4 disposed in grooves HM and between a first support member SM1_1 and a second support member SM2_1, and a planarization member PM_3, is a double-sided adhesive film.

More specifically, according to an embodiment, the first support member SM1_1 includes at least one planarization member PM_3 on one side thereof that is adjacent to a folding axis FX.

According to an embodiment, each of the first support member SM1_1 and the second support member SM2_1 includes a plurality of grooves HM formed at regular intervals in a second direction DR2 on sides that face each other with respect to the folding axis FX. According to an embodiment, ignoring a distance D0 between the first support member SM1_1 and the second support member SM2_1, a size of the groove HM in a plan view is substantially the same as that of the planarization member PM_3. A thickness of the groove HM in a third direction DR3 is substantially the same as the thickness H1 of the planarization member PM_3. However, embodiments of the present disclosure are not limited thereto, and in other embodiments, the size of the groove HM in a plan view is greater than that of the planarization member PM_3 to provide a process margin and a use margin.

According to an embodiment, the plurality of planarization members PM_3 have a rectangular shape with a thickness H1 in the third direction DR3 that is much less than its lengths in the first and second directions DR1 and DR2. According to an embodiment, a length of the planarization members PM in the first direction DR1 is greater than a length of the planarization members PM in the second direction DR2. The plurality of planarization members PM_3 are inserted into the grooves HM that are formed in one side of the first support member SM1_1 adjacent to the folding axis FX, and disposed at regular intervals in the second direction DR2.

According to an embodiment, one side of the planarization members PM_3 is fixed to the grooves HM formed in the first support member SM1_1. According to an embodiment, the planarization members PM_3 are fixedly attached to the grooves HM in the first support member SM1_1 adjacent to the folding axis FX by an adhesive member PSA3_4. According to an embodiment, the adhesive member PSA3_4 is a double-sided adhesive film in which both of upper and lower surfaces are adhesive. The adhesive member PSA3_4 is disposed between surfaces of the grooves HM formed in the first support member SM1_1 and the second support member SM2_1 and the planarization member PM_3.

According to an embodiment, the adhesive member PSA3_4 includes a first adhesive member PSA3_41 and a second adhesive member PSA3_42. An upper surface of the adhesive member PSA3_41 disposed in the groove HM in the first support member SM1_1 is attached to a surface of the groove HM in the first support member SM1_1, and a lower surface of the adhesive member PSA3_41 is attached to an upper surface of the planarization member PM_3. Each of the plurality of planarization members PM_3 may be fixedly attached by an independent adhesive member PSA3_41.

According to an embodiment, an upper surface of the adhesive member PSA3_42 in a space between the first support member SM1_1 and the second support member SM2_1 and on one surface of the groove HM in the second support member SM2_1 is not adhesive. According to an embodiment, the upper surface of the adhesive member PSA3_42 in the space between the first support member SM1_1 and the second support member SM2_1 and in a overlap region of the groove HM in the second support member SM2_1 and the planarization member PM_3 is processed to have zero adhesive force by fluorine-based coating or UV light irradiation. A portion of the first adhesive member PSA3_41 extends between the planarization member PM_3 and the second adhesive member PSA3_42 in a region that overlaps the space between the first support member SM1_1 and the second support member SM2_1 and where the second support member SM2_1 and the planarization member PM_3 overlap. The upper surface of the first adhesive member PSA3_41 is attached to the lower surface of the second adhesive member PSA3_42.

According to an embodiment, the other side of the planarization member PM_3 can be detached from the groove HM in the second support member SM2_1 adjacent to the folding axis FX. According to an embodiment, the planarization member PM_3 is a magnetic material. For example, the magnetic material is a permanent magnet. In this case, the magnetic material always maintains a magnetic field. As described above, the second support member SM2_1 includes a metal and a magnetic material such as stainless steel (SUS). Therefore, when the display device 1000 is unfolded, an attractive force due to the magnetic field acts between the other side of the planarization member PM_3 and the second support member SM2_1.

According to an embodiment, one surface of each of the grooves HM formed in the first and second support members SM1_1 and SM2_1 is attached to the upper surfaces of the planarization member PM_3 via the adhesive member PSA3_4 so that the surfaces of the grooves HM in each of the first and second support members SM1_1 and SM2_1 are located on the same reference surface. Therefore, no step is generated in the third direction DR3 between the first support member SM1_1 and the second support member SM2_1. Furthermore, each of the plurality of planarization members PM_3 is inserted into the grooves HM in the first and second support members SM1_1 and SM2_1 so that the first support member SM1_1 and the second support member SM2_1 are arranged in the first and second directions DR1 and DR2.

Further, according to an embodiment, since an attractive force is present between the magnetic planarization member PM_3 and the metallic second support member SM2_1, no gap is generated between the planarization member PM_3 and the second support member SM2_1. Therefore, when the display device 1000 is unfolded, the unfolded state can be maintained. Furthermore, due to the adhesive member PSA3_4 disposed between the groove HM in the second support member SM2_1 and the planarization member PM_3, the planarization member PM_3 easily disconnects from the surface of the groove HM in the second support member SM2_1 when the display device 1000 is folded.

In concluding the detailed description, those skilled in the art will appreciate that many variations and modifications can be made to the exemplary embodiments without substantially departing from the principles of the present disclosure. Therefore, the disclosed exemplary embodiments of the disclosure are used in a generic and descriptive sense only and not for purposes of limitation.

What is claimed is:

1. A display device, comprising:
   a display module;
   a first support member and a second support member disposed below the display module and separated from each other, wherein the first support member and second support member are disposed with respect to a folding axis therebetween;
   a planarization member disposed on one side of the first support member and that maintains one surface of the first support member and one surface of the second support member on a same reference surface;
   a third support member disposed below the first support member,
   a fourth support member disposed below the second support member, and
   hinge members disposed below the third and fourth support members, wherein the hinge members extend parallel to an extension direction of the folding axis and overlap the folding axis, and
   wherein the planarization member is fixedly attached to the one side of the first support member by an adhesive member and is detachable from the second support member.

2. The display device of claim 1, wherein the planarization member is fixed to the first support member by an adhesive member.

3. The display device of claim 1, wherein:
   each of the planarization member, the first support member and the second support member has a rectangular shape in a plan view that extends in a first direction and a second direction that crosses the first direction, and has a thickness in a direction normal to a plane defined by the first and second directions,
   and
   a thickness of the planarization member is less than a thickness of each of the first and second support members.

4. The display device of claim 3, wherein an area of the planarization member in a plan view is proportional to any one of a size of an area, the thickness, and a modulus of each of the first and second support members.

5. The display device of claim 3, wherein the thickness of the planarization member is proportional to any one of a size of an area, the thickness, and a modulus of each of the first and second support members.

6. The display device of claim 1, further comprising one or more grooves formed in the first support member and the second support member, wherein the one or more grooves are spaced apart along the folding axis at regular intervals in one side of the first support member and one side of the second support member, wherein the first and second support members face each other.

7. The display device of claim 6, wherein the planarization member is inserted into the groove, wherein one surface of the planarization member is fixed by a double-sided adhesive film to one surface of the groove in the first support member.

8. The display device of claim 7, wherein a surface of the double-sided adhesive film that faces a surface of the groove in the second support member is not adhesive.

9. The display device of claim 1, wherein the planarization member maintains one surface of the first support member and one surface of the second support member on a same reference surface.

10. The display device of claim 1, wherein the planarization member includes a magnetic material that has a magnetic field, and the first and second support members include a metal material and a magnetic material.

11. The display device of claim 1, wherein the third and fourth support members face each other.

12. A display device comprising:
   a display module that includes a first non-foldable region, a second non-foldable region, and a foldable region located between the first non-foldable region and the second non-foldable region; and
   a foldable member disposed below the display module,
   wherein the foldable member includes a first support member disposed below the first non-foldable region and a second support member disposed below the second non-foldable region, wherein the first and second support members are separated from each other, wherein the first support member and second support member are disposed with respect to a folding axis therebetween,
   a third support member disposed below the first support member,
   a fourth support member disposed below the second support member, and
   hinge members disposed below the third and fourth support members, wherein the hinge members extend parallel to an extension direction of the folding axis and overlap the folding axis,
   wherein the third and fourth support members face each other, and
   a planarization member that maintains one surface of the first support member and one surface of the second support member on a same reference surface.

13. The display device of claim 12, wherein the planarization member is fixed to the first support member by an adhesive member and is detachable from the second support member.

14. The display device of claim 12, wherein the planarization member includes a magnetic material that has a magnetic field, and the first and second support members include a metal material and a magnetic material.

15. The display device of claim 12, wherein:
   each of the planarization member, the first support member and the second support member has a rectangular shape in a plan view that extends in a first direction and a second direction that crosses the first direction, and has a thickness in a direction normal to a plane defined by the first and second directions,
   and
   a thickness of the planarization member is less than a thickness of each of the first and second support members.

16. The display device of claim 15, wherein an area of the planarization member in a plan view is proportional to any one of a size of an area, the thickness, and a modulus of each of the first and second support members.

17. The display device of claim 15, wherein the thickness of the planarization member is proportional to any one of a size of an area, the thickness, and a modulus of each of the first and second support members.

18. The display device of claim 12, wherein the planarization member overlaps the foldable region.

19. The display device of claim 12, wherein each of the first non-foldable region and the second non-foldable region is respectively fixed to the first support member and the second support member by a double-sided adhesive film.

20. The display device of claim 12, wherein portions of upper surfaces of the first and second support members include a height compensating film in the foldable region, wherein at least one surface of upper and lower surfaces of the height compensating film is not adhesive.

* * * * *